US012690303B2

(12) United States Patent
Cho et al.

(10) Patent No.: US 12,690,303 B2
(45) Date of Patent: Jul. 21, 2026

(54) DISPLAY DEVICE

(71) Applicant: Samsung Display Co., Ltd., Yongin-Si (KR)

(72) Inventors: Maeum Cho, Yongin-si (KR); Kyongjun Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 404 days.

(21) Appl. No.: 18/370,416

(22) Filed: Sep. 20, 2023

(65) Prior Publication Data

US 2024/0105881 A1     Mar. 28, 2024

(30) Foreign Application Priority Data

Sep. 23, 2022    (KR) ........................ 10-2022-0120549

(51) Int. Cl.
| | |
|---|---|
| *H10K 59/12* | (2023.01) |
| *H10H 20/819* | (2025.01) |
| *H10H 20/84* | (2025.01) |
| *H10H 20/857* | (2025.01) |
| *H10K 59/40* | (2023.01) |

(52) U.S. Cl.
CPC .......... *H10H 20/84* (2025.01); *H10H 20/819* (2025.01); *H10H 20/857* (2025.01)

(58) Field of Classification Search
CPC ......... H01L 33/44; H01L 33/20; H01L 33/62; H01K 59/12; H01K 59/40; H01K 59/8792
See application file for complete search history.

(56) References Cited

U.S. PATENT DOCUMENTS

| | | | |
|---|---|---|---|
| 6,268,895 B1 * | 7/2001 | Shimada ........... | G02F 1/134309 |
| | | | 349/110 |
| 7,719,637 B2 | 5/2010 | SangYoon et al. | |
| 2015/0179586 A1 * | 6/2015 | Youk ..................... | H01L 23/544 |
| | | | 427/58 |
| 2017/0082885 A1 * | 3/2017 | Lee ..................... | H10D 86/021 |
| 2017/0186824 A1 | 6/2017 | Lee et al. | |
| 2019/0229175 A1 | 7/2019 | Lhee et al. | |
| 2021/0124391 A1 | 4/2021 | Kim et al. | |

FOREIGN PATENT DOCUMENTS

| | | |
|---|---|---|
| KR | 10-0692863 B1 | 3/2007 |
| KR | 10-1183374 B1 | 9/2012 |
| KR | 10-1602422 B1 | 3/2016 |
| KR | 10-2017-0078980 A | 7/2017 |
| KR | 10-2019-0090905 A | 8/2019 |
| KR | 10-2021-0052655 A | 5/2021 |

* cited by examiner

*Primary Examiner* — Joseph L Williams
(74) *Attorney, Agent, or Firm* — Innovation Counsel LLP

(57) ABSTRACT

A display device includes a substrate including a display area and a non-display area surrounding the display area, a conductive pattern disposed on the substrate in the non-display area and including an opening pattern and a light blocking member disposed in the non-display area on the conductive pattern and including an opening disposed in an area overlapping the opening pattern, wherein the opening pattern and the opening may constitute alignment marks in the non-display area.

20 Claims, 14 Drawing Sheets

OPP : CCV, CVX

OPP:CCV,CVX

OPP:CCV,CVX,SPP

OPP : CCV, CVX

FIG. 10

OPP : CCV, CVX

FIG. 12

OPP:CCV,CVX

FIG. 14

OPP:CCV,CVX

OPP:CCV,CVX

OPP:CCV,CVX

DISPLAY DEVICE

CROSS-REFERENCE TO RELATED APPLICATION(S)

This application claims priority under 35 USC § 119 to Korean Patent Application No. 10-2022-0120549 filed on Sep. 23, 2022, in the Korean Intellectual Property Office (KIPO), the entire disclosure of which is incorporated by reference herein.

BACKGROUND

1. Field

Embodiments relate to a display device. More particularly, embodiments relate to an alignment mark used in a manufacturing process of the display device.

2. Description of the Related Art

The display device is a device that displays an image for providing visual information to a user. Among display devices, an organic light emitting diode display has recently attracted attention.

The organic light-emitting display device has a self-emission characteristic and does not require a separate light source, unlike a liquid crystal display device, so that the thickness and weight may be reduced. In addition, the organic light emitting diode display exhibits high quality characteristics such as low power consumption, high luminance, and high reaction speed.

Alignment marks may be formed in the display device. The alignment marks may be used in the manufacturing process. For example, the alignment marks may indicate positions of members in a manufacturing process of a display device. That is, the alignment marks may be variously formed on the display device within a range in which the members may be accurately positioned. However, when the alignment marks are formed in an embossed pattern, the alignment marks may be lost due to a step difference such as a protruding member.

SUMMARY

Embodiments provide a display device with improved recognition rate of an alignment mark.

A display device according to an embodiment may include a substrate including a display area and a non-display area surrounding the display area, a conductive pattern disposed on the substrate in the non-display area and including an opening pattern and a light blocking member disposed in the non-display area on the conductive pattern and including an opening disposed in an area overlapping the opening pattern, wherein the opening pattern and the opening may constitute alignment marks in the non-display area.

In an embodiment, the opening pattern may include convex portions and concave portions disposed between the convex portions.

In an embodiment, each of the alignment marks may have an intaglio shape and the intaglio shape may have one of a rectangle, a triangle, and a rhombus shape in a plan view.

In an embodiment, the light blocking member may include at least one of carbon black, a black pigment, and a black dye.

In an embodiment, the display device may further include a first protruding member disposed on the substrate in the non-display area, overlapping the conductive pattern, and surrounding the display area.

In an embodiment, the light blocking member may be disposed on the first protruding member and the opening may be disposed in an area overlapping the first protruding member.

In an embodiment, the conductive pattern may further include a sub-opening pattern disposed in an area overlapping the first protruding member.

In an embodiment, the display device may further include a second protruding member disposed on the substrate in the non-display area and surrounding the first protruding member.

In an embodiment, the opening pattern may be disposed between the first protruding member and the second protruding member in a plan view.

In an embodiment, the opening may be disposed in an area overlapping an area disposed between the first protruding member and the second protruding member in the non-display area in a plan view.

In an embodiment, the light blocking member may be disposed on the second protruding member and may overlap the second protruding member.

In an embodiment, the first protruding member may include a first sub-protruding member disposed on the substrate and a second sub-protruding member disposed on the first sub-protruding member, and the light blocking member may be disposed between the first sub-protruding member and the second sub-protruding member on the conductive pattern.

In an embodiment, the second protruding member may include a third sub-protruding member disposed on the substrate and a fourth sub-protruding member disposed on the third sub-protruding member, and the light blocking member may be disposed between the third sub-protruding member and the fourth sub-protruding member.

A display device according to an embodiment may include a substrate including a display area and a non-display area surrounding the display area, a conductive pattern disposed on the substrate in the non-display area and including an opening pattern, a first light blocking member disposed in the non-display area and on the conductive pattern and a second light blocking member disposed in the non-display area, on the first light blocking member, and defining an opening with the first light blocking member in a plan view, wherein the opening may be disposed in an area overlapping the opening pattern.

In an embodiment, the display device may further include a first protruding member disposed on the substrate in the non-display area, overlapping the conductive pattern, and surrounding the display area and a second protruding member disposed on the substrate in the non-display area and surrounding the first protruding member.

In an embodiment, the opening pattern may include convex portions and concave portions disposed between the convex portions, and the convex portions and the concave portions may be disposed between the first light blocking member and the second light blocking member in a plan view.

In an embodiment, the concave portions and the first light blocking member may constitute alignment marks in the non-display area.

In an embodiment, the opening may be disposed in an area overlapping the alignment marks, and the first light blocking member may overlap the second protruding member.

In an embodiment, the concave portions included in the conductive pattern and the second light blocking member may constitute alignment marks in the non-display area.

In an embodiment, the opening may be disposed in an area overlapping the alignment marks, and the second light blocking member may overlap the second protruding member.

In the display device according to the present disclosure, since the alignment mark is defined in an intaglio shape in the non-display area using the light blocking member and the conductive pattern, residual film and loss of the alignment marks due to the step of the first protruding member and the second protruding member may be prevented. That is, since the alignment marks are formed in the intaglio shape instead of an embossed shape, the shape of the alignment marks may be maintained. Accordingly, the recognition rate of the alignment marks may be improved, and the efficiency of the manufacturing process of the display device may be improved.

BRIEF DESCRIPTION OF THE DRAWINGS

FIG. 10 is a cross-sectional view taken along line III-III' of FIG. 9.

FIG. 12 is a cross-sectional view taken along line IV-IV' of FIG. 9.

FIG. 14 is a cross-sectional view taken along line V-V' of FIG. 13.

DETAILED DESCRIPTION OF THE EMBODIMENTS

Figure 1:
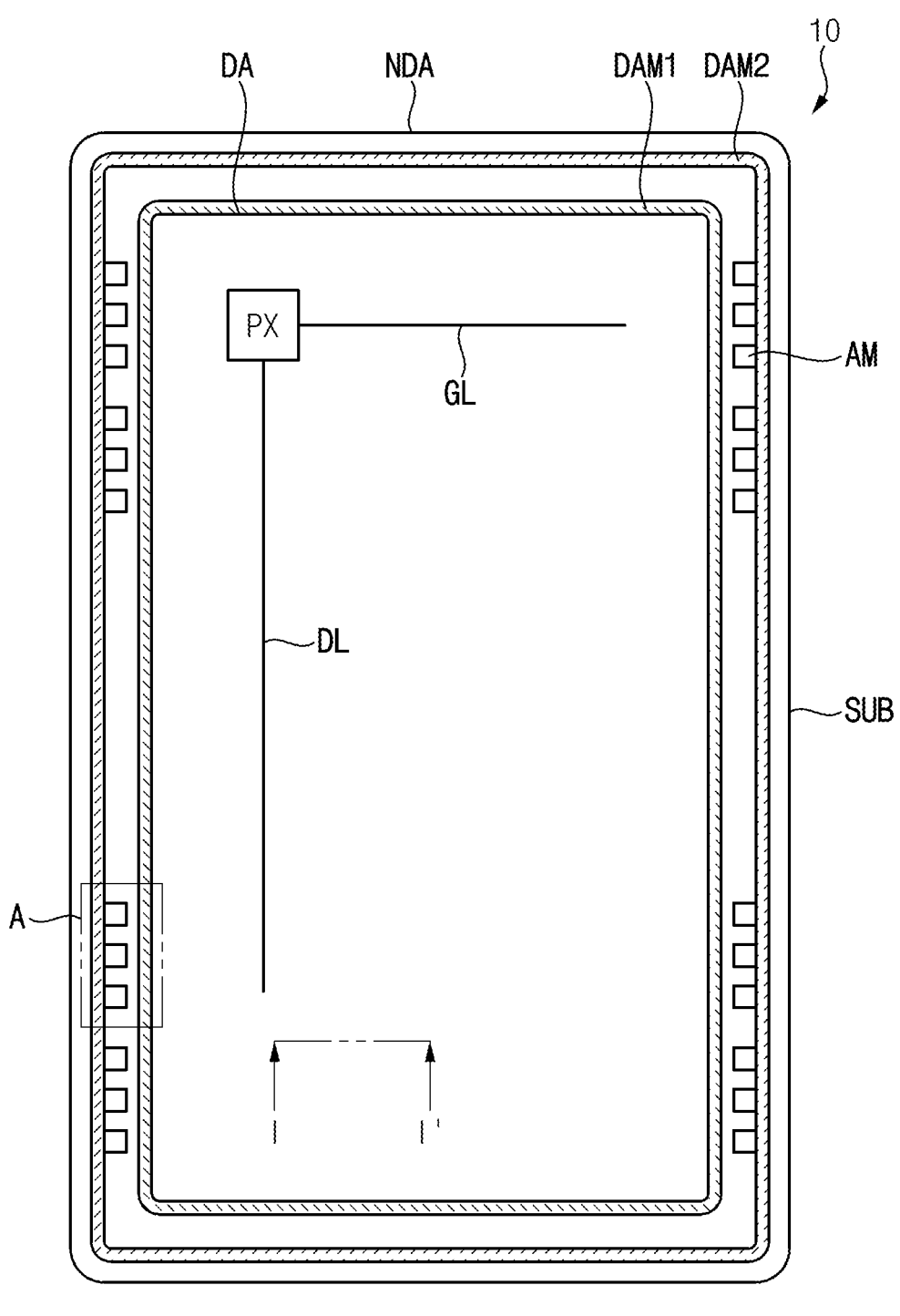
FIG. 1 is a plan view of a display device according to an embodiment of the present disclosure.

Hereinafter, display devices in accordance with embodiments will be described in more detail with reference to the accompanying drawings. The same reference numerals are used for the same components in the drawings, and redundant descriptions of the same components will be omitted.

FIG. 1 is a plan view of a display device according to an embodiment of the present disclosure.

Referring to FIG. 1, a display device 10 may include a substrate SUB. The substrate SUB—may include a display area DA and a non-display area NDA. The display area DA may be an area displaying an image. The non-display area NDA may surround the display area DA. The non-display area NDA may be an area that does not display the image.

Pixels PX may be disposed in the display area DA. The pixels PX may display the image by emitting light. In addition, wirings connected to the pixels PX and transmitting signals to the pixels PX may be disposed in the display area DA. For example, the wirings may include data lines DL transmitting data signals and gate lines GL transmitting gate signals.

At least one protruding member may be disposed in the non-display area NDA on the substrate SUB. For example, a first protruding member DAM and a second protruding member DAM2 may be disposed in the non-display area NDA.

The first protruding member DAM1 may be disposed outside the display area DA. The first protruding member DAM1 may surround the display area DA. The first protruding member DAM1 may enclose an organic encapsulation layer (e.g., an organic encapsulation layer OEL of FIG. 2) disposed in the display area DA. That is, the first protruding member DAM1 may prevent the organic encapsulation layer from overflowing to an outer portion of the non-display area NDA.

The second protruding member DAM2 may be disposed outside the display area DA. The second protruding member DAM2 may surround the first protruding member DAM1. The second protruding member DAM2 may support a mask positioned on the display device 10 during a manufacturing process of the display device 10. The mask may not directly contact the display panel DP included in the display device 10 due to the second protruding member DAM2. However, the present disclosure is not limited thereto.

Alignment marks AM may be disposed in the non-display area NDA. The alignment marks AM may be used during the manufacturing process. For example, the alignment marks AM may be used to align constituents in the display device 10 each other in a manufacturing process of the display device 10. Although a total of 24 alignment marks AM are shown in FIG. 1, this is exemplary, and the alignment marks AM may be formed on the substrate SUB in various ways to accurately align the constituents each other.

For example, the alignment marks AM may be formed on a side surface of the substrate SUB. Alternatively, the alignment marks AM may be formed on each corner of an upper surface of the substrate SUB. However, the present disclosure is not limited thereto.

Figure 2:
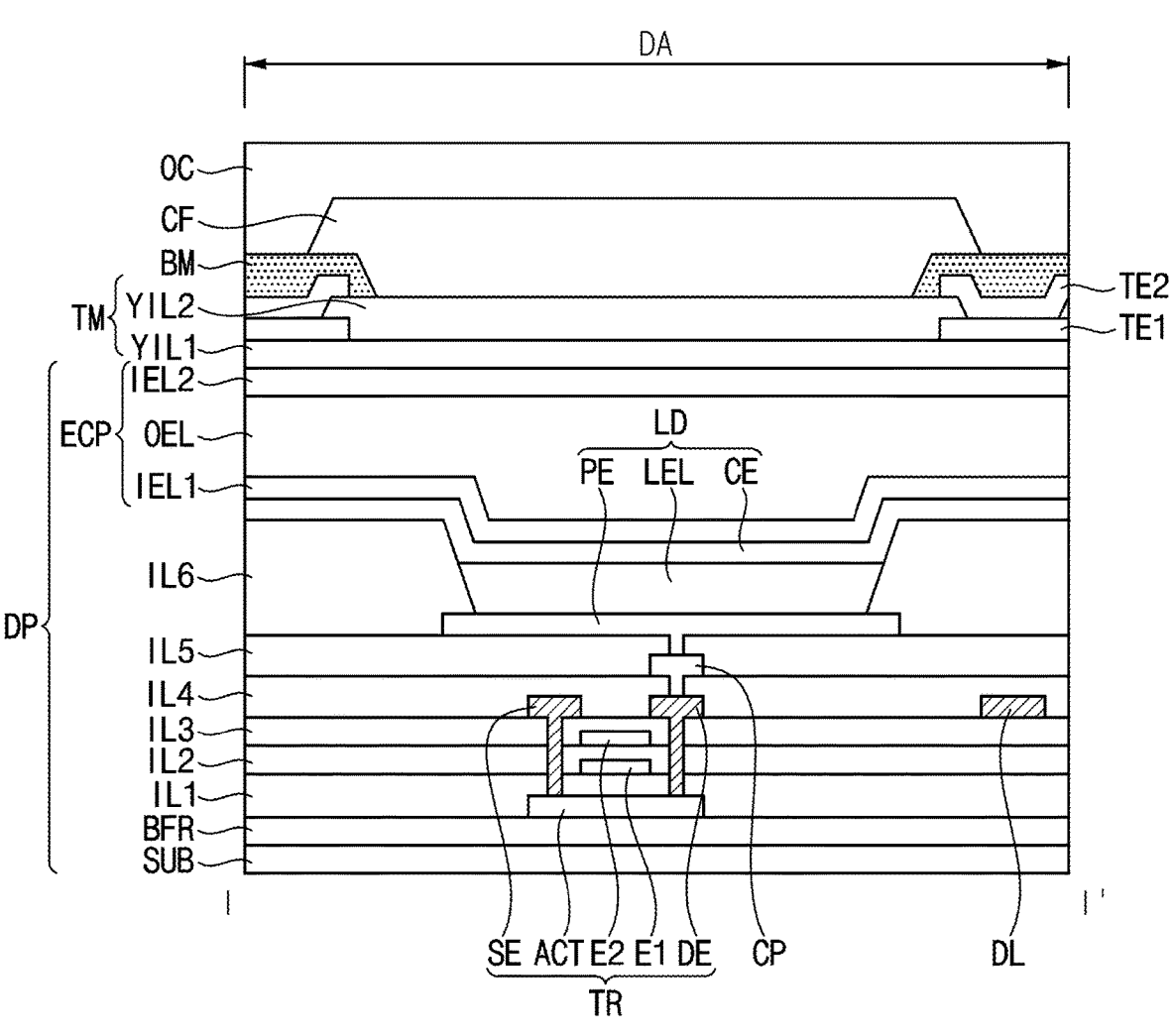
FIG. 2 is a cross-sectional view taken along line I-I' of FIG. 1.

FIG. 2 is a cross-sectional view taken along line I-I' of FIG. 1.

Referring to FIGS. 1 and 2, the display device 10 may include a display panel DP, a touch member TM, a black matrix BM, a color filter layer CF, and an overcoat layer OC. In the display area DA, the display panel DP may include the substrate SUB, a buffer layer BFR, insulating layers, a transistor TR, a data line DL, a connection pattern CP, and a light emitting diode LD, and an encapsulation layer ECP.

The buffer layer BFR may be disposed on the substrate SUB. The buffer layer BFR may be disposed in the display area DA and the non-display area NDA. The buffer layer BFR may prevent diffusion of metal atoms or impurities from the substrate SUB into the active layer ACT.

The transistor TR may be disposed in the display area DA on the substrate SUB. The transistor TR may include an active layer ACT, a gate electrode E1, a source electrode SE, and a drain electrode DE.

In the display area DA, the active layer ACT may be disposed on the buffer layer BFR. The active layer ACT may include a source region and a drain region doped with impurities and a channel region disposed between the source region and the drain region.

A first insulating layer IL1 may be disposed on the buffer layer BFR. The first insulating layer IL1 may cover the active layer ACT in the display area DA and may have substantially the same thickness along a profile of the active layer ACT. However, embodiments according to the present disclosure are not limited thereto. In an embodiment, the first insulating layer IL1 may include an inorganic material. The first insulating layer IL1 may extend from the display area DA to the non-display area NDA. That is, the first insulating layer IL1 may be entirely disposed in the display area DA and the non-display area NDA.

In the display area DA, the gate electrode E1 may be disposed on the first insulating layer ILL The gate electrode E1 may overlap the channel region of the active layer ACT. A second insulating layer IL2 may be disposed on the first insulating layer IL1. In addition, the second insulating layer IL2 may cover the gate electrode E1 and may be disposed with substantially the same thickness along a profile of the gate electrode E1. However, embodiments according to the present disclosure are not limited thereto. In an embodiment, the second insulating layer IL2 may include an inorganic material. The second insulating layer IL2 may extend from the display area DA to the non-display area NDA.

An upper electrode E2 may be disposed on the second insulating layer IL2 in the display area DA to overlap the gate electrode E1 in a plan view. The upper electrode E2 may be a capacitor electrode. The upper electrode E2, the gate electrode E1 and the second insulating layer IL2 may constitute a capacitor.

A third insulating layer IL3 may be disposed on the second insulating layer IL2. In addition, the third insulating layer IL3 may cover the upper electrode E2 and may be disposed with substantially the same thickness along a profile of the upper electrode E2. However, the present disclosure is not limited thereto. In an embodiment, the third insulating layer IL3 may include an inorganic material. The third insulating layer IL3 may extend from the display area DA to the non-display area NDA.

A first conductive layer may be disposed on the third insulating layer IL3 in the display area DA. The first conductive layer may include a source electrode SE, a drain electrode DE, and a data line DL.

The source electrode SE and the drain electrode DE may be disposed on the third insulating layer IL3. The source electrode SE may contact the source region of the active layer ACT through a first contact hole formed in the first to third insulating layers IL1, IL2, and IL3. The drain electrode DE may contact the drain region of the active layer ACT through a second contact hole formed in the first to third insulating layers IL1, IL2, and IL3.

The data line DL may be disposed on the third insulating layer IL3. The data line DL may be connected to the transistor TR. The data line DL may transmit the data signal to the transistor TR.

In the display area DA, a fourth insulating layer IL4 may be disposed on the third insulating layer IL3. In addition, the fourth insulating layer IL4 may cover the source electrode SE, the drain electrode DE, and the data line DL, and may have a substantially flat upper surface without creating a step around the source electrode SE, the drain electrode DE, and the data line DL. However, the present disclosure is not limited thereto. In an embodiment, the fourth insulating layer IL4 may include an organic material. The fourth insulating layer IL4 may extend from the display area DA to the non-display area NDA.

A second conductive layer may be disposed on the fourth insulating layer IL4 in the display area DA. The second conductive layer may include the connection pattern CP and the like.

The connection pattern CP may be disposed on the fourth insulating layer IL4. The connection pattern CP may contact the drain electrode DE or the source electrode SE through a third contact hole formed in the fourth insulating layer IL4.

In the display area DA, a fifth insulating layer IL5 may be disposed on the fourth insulating layer IL4. The fifth insulating layer IL5 may cover the connection pattern CP and may have a substantially flat upper surface without creating a step around the connection pattern CP. However, the present disclosure is not limited thereto. In an embodiment, the fourth insulating layer IL4 may include an organic material.

In the display area DA, the light emitting diode LD may be disposed on the fifth insulating layer IL5. The light emitting diode LD may include a pixel electrode PE, a light emitting layer LEL, and a common electrode CE. The pixel electrode PE may have reflective or light-transmitting properties. For example, the pixel electrode PE may include metal.

The pixel electrode PE may contact the connection pattern CP through a fourth contact hole formed in the fifth insulating layer. Through this, the pixel electrode PE may be connected to the transistor TR.

In the display area DA, a sixth insulating layer IL6 may be disposed on the fifth insulating layer IL5. An opening exposing an upper surface of the pixel electrode PE may be defined in the sixth insulating layer IL6. For example, the sixth insulating layer IL6 may include an organic material.

A spacer may be disposed on the sixth insulating layer IL6 in the display area DA. For example, the spacer may include an organic material. The spacer may maintain a gap between the encapsulation layer ECP and the substrate SUB.

The light emitting layer LEL may be disposed on the pixel electrode PE. The light emitting layer LEL may be disposed in the opening formed in the sixth insulating layer IL6. In an embodiment, the light emitting layer LEL may have a multilayer structure including a hole injection layer, a hole transport layer, an organic light emitting layer, an electron transport layer, and an electron injection layer. The organic light emitting layer may include a light emitting material.

The common electrode CE may cover the light emitting layer LEL and may be disposed on the sixth insulating layer IL6. In an embodiment, the common electrode CE may have a plate shape. Also, the common electrode CE may have light transmission or reflection properties. For example, the common electrode CE may include metal. The common electrode CE may extend from the display area DA to the non-display area NDA.

The encapsulation layer ECP may prevent penetration of moisture and oxygen into the light emitting diode LD from the outside. For example, the encapsulation layer ECP may include a first inorganic encapsulation layer IEL1, an organic encapsulation layer OEL, and a second inorganic encapsulation layer IEL2.

The first inorganic encapsulation layer IEL1 may be disposed on the common electrode CE and may have substantially the same thickness along a profile of the common electrode CE. The organic encapsulation layer OEL may be disposed on the first inorganic encapsulation layer IEL1, and may have a substantially flat upper surface without creating a step around the first inorganic encapsulation layer TELL The second inorganic encapsulation layer IEL2 may be disposed on the organic encapsulation layer OEL.

The organic encapsulation layer OEL may be disposed in portions of the display area DA and the non-display area NDA. The first inorganic encapsulation layer IEL1 and the second inorganic encapsulation layer IEL2 may extend from the display area DA to the non-display area NDA.

The touch member TM may be disposed on the display panel DP. The touch member TM may include a first touch electrode TE1, a second touch electrode TE2, a first touch insulating layer YIL1, and a second touch insulating layer YIL2.

The first touch insulating layer YL1 may be disposed on the encapsulation layer ECP. Examples of materials that can be used as the first touch insulating layer YIL1 may include silicon oxide, silicon nitride, and silicon oxynitride. These may be used alone or in combination with each other. The first touch insulating layer YL1 may extend from the display area DA to the non-display area NDA.

The first touch electrode TE1 may be disposed on the first touch insulating layer YL1. In an embodiment, the first touch electrode TE1 may be disposed in a non-emission area. That is, the first touch electrode TE1 may overlap the sixth insulating layer IL6 on the sixth insulating layer IL6. The first touch electrode TE1 may include a metal, an alloy, a conductive metal oxide, a transparent conductive material, or the like.

The second touch insulating layer YIL2 may cover the first touch electrode TE1. The second touch insulating layer YIL2 may include an inorganic insulating material. Examples of materials that may be used as the second touch insulating layer YIL2 may include silicon oxide, silicon nitride, and silicon oxynitride. These may be used alone or in combination with each other. A contact hole exposing a portion of the first touch electrode TE1 may be defined in the second touch insulating layer YIL2.

The second touch electrode TE2 may be disposed on the second touch insulating layer YIL2 and may overlap the first touch electrode TE1. That is, the second touch electrode TE2 may be disposed in the non-emission area of the display device 10 on the sixth insulating layer IL6. The second touch electrode TE2 may electrically contact the first touch electrode TE1 through the contact hole exposing a portion of the first touch electrode TE1. The second touch electrode TE2 may include a metal, an alloy, a conductive metal oxide, a transparent conductive material, or the like.

The first touch electrode TE1 and the second touch electrode TE2 may constitute a touch electrode. In an embodiment, the touch electrode may have a mesh structure in a plan view. However, the present disclosure is not limited thereto, and a structure of the touch electrode may vary.

The black matrix BM may be disposed on the second touch insulating layer YIL2 on the sixth insulating layer IL6. In an embodiment, the black matrix BM may entirely overlap the non-emission area and may have a grid shape in the plan view. That is, the black matrix BM may overlap the sixth insulating layer IL6 and the touch electrode TE1 and TE2. In an embodiment, the black matrix BM may cover the second touch electrode TE2.

In an embodiment, the black matrix BM may absorb external light. Accordingly, the black matrix BM may reduce an external light reflectance of the display device 10. The black matrix BM may include at least one of carbon black, a black pigment, and a black dye. These may be used alone or in combination with each other.

In an embodiment, the black matrix BM may define a plurality of openings exposing a portion of the second touch insulating layer YIL2. For example, the black matrix BM may define an opening corresponding to the light emitting diode LD. That is, the opening may overlap the light emitting diode LD.

In another embodiment, a touch protection layer (not shown) may be additionally disposed between the second touch insulating layer YIL2 and the black matrix BM. In this case, the second touch electrode TE2 may be covered by the touch protection layer. The black matrix BM may overlap the touch electrode on the touch protection layer. Examples of materials that may be used as the touch protection layer may include silicon oxide, silicon nitride, and silicon oxynitride. These may be used alone or in combination with each other.

The color filter layer CF may be disposed on the second touch insulating layer YIL2. If the touch protection layer is additionally disposed, the color filter layer CF may be disposed on the touch protection layer.

The color filter layer CF may be disposed in the opening defined by the black matrix BM. In an embodiment, the color filter layer CF may partially overlap the black matrix BM. The color of light emitted from the light emitting element LD may be more distinctly recognized as it passes through the color filter layer CF.

In an embodiment, the color filter layer CF may transmit light of a specific color and block light of a color other than the specific color. For example, the color filter layer CF may include a dye and/or a pigment that absorbs light of a color other than the specific color.

The overcoat layer OC may be disposed on the black matrix BM and the color filter layer CF. The overcoat layer OC may cover the black matrix BM and the color filter layer CF. Accordingly, reliability of the black matrix BM and the color filter layer CF may be improved. In an embodiment, the overcoat layer OC may have a substantially flat upper surface. Accordingly, the overcoat layer OC may compensate for a step difference on a lower surface. In an embodiment, the overcoat layer OC may include an organic material. Examples of organic materials that can be used as the overcoat layer OC may include photoresist, polyacrylic resin, polyimide resin, acrylic resin, epoxy resin, acrylate resin, and the like. These may be used alone or in combination with each other.

Figure 3:
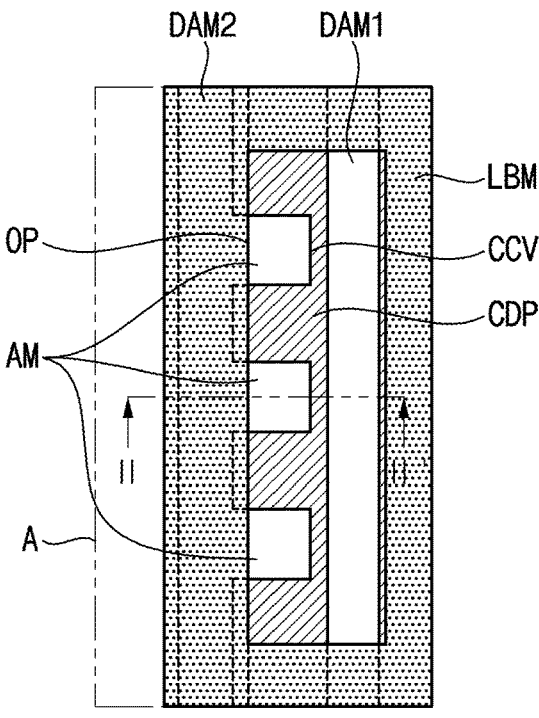
FIG. 3 is an enlarged plan view of area A of FIG. 1.
Figure 4:
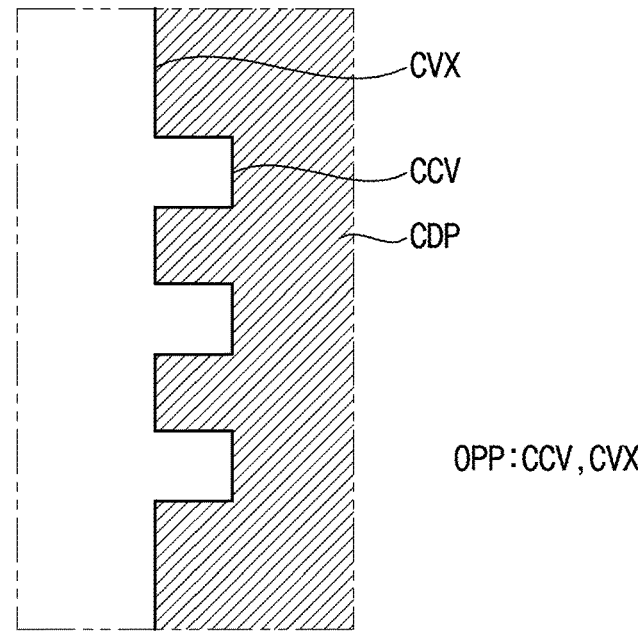
FIG. 4 is a plan view illustrating only the conductive pattern of FIG. 3.
Figure 5:
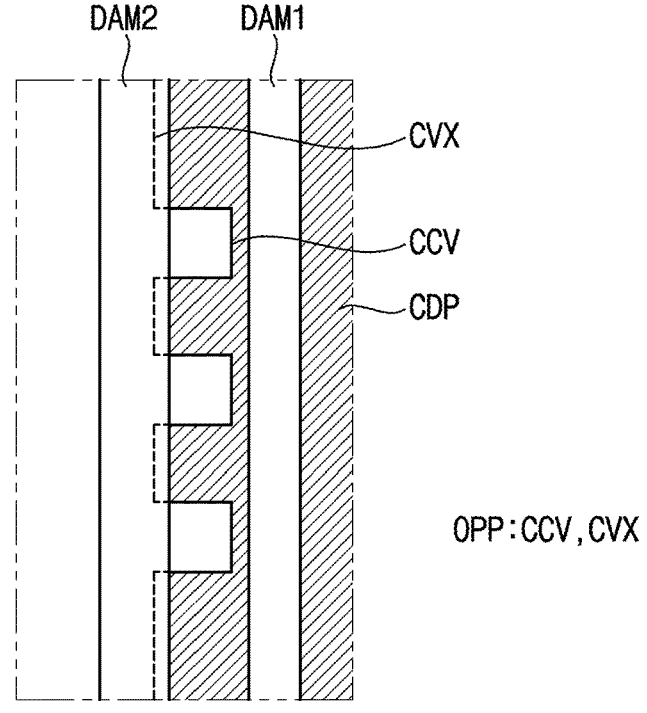
FIG. 5 is a plan view illustrating the conductive pattern, the first protruding member, and the second protruding member of FIG. 3.

FIG. 3 is an enlarged plan view of area A of FIG. 1. FIG. 4 is a plan view illustrating only the conductive pattern of FIG. 3. FIG. 5 is a plan view illustrating the conductive pattern, the first protruding member, and the second protruding member of FIG. 3.

Further referring to FIGS. 3 to 5, a conductive pattern CDP may be disposed in the non-display area NDA on the substrate SUB. The conductive pattern CDP may be disposed on the same layer as the first conductive layer (e.g., the source electrode SE, the drain electrode DE, and the data line DL) disposed in the display area DA. In this case, the conductive pattern CDP may be connected to a part of the first conductive layer of the display area DA. However, the present disclosure is not limited thereto, and the conductive pattern CDP may be disposed on the same layer as the second conductive layer (e.g., the connection pattern CP). In this case, the conductive pattern CDP may be connected to a part of the second conductive layer of the display area DA.

In an embodiment, the conductive pattern CDP may include an opening pattern OPP. Specifically, the conductive pattern CDP may have a concavo-convex structure in a plan view. For example, the opening pattern OPP may include convex portions CVX and concave portions CCV in the plan view. The concave portions CCV may be disposed between the convex portions CVX. However, a shape of the opening pattern OPP is not limited thereto.

The first protruding member DAM1 and the second protruding member DAM2 may be disposed in the non-display area NDA on the substrate SUB. The first protruding member DAM1 may overlap the conductive pattern CDP on the conductive pattern CDP. For example, the first protruding member DAM1 may be completely overlapped with the conductive pattern CDP. The second protruding member DAM2 may partially overlap the conductive pattern CDP. For example, the second protruding member DAM2 may overlap the convex portions CVX and may not overlap the concave portions CCV. However, the present disclosure is not limited thereto, and the second protruding member DAM2 may not overlap the conductive pattern CDP.

In an embodiment, the second protruding member DAM2 may be spaced apart from the first protruding member DAM1. The opening pattern OPP may be disposed between the first protruding member DAM1 and the second protruding member DAM2 in the plan view. In detail, the concave portions CCV and the convex portions CVX may be disposed between the first protruding member DAM1 and the second protruding member DAM2 in the plan view.

The light blocking member LBM may be disposed in the non-display area NDA. The light blocking member LBM may be disposed on the conductive pattern CDP, and may be disposed on the first protruding member DAM1 and the second protruding member DAM2.

In an embodiment, the light blocking member LBM may include an opening OP. The opening OP may expose an area disposed between the first protruding member DAM1 and the second protruding member DAM2 in the non-display area NDA in the plan view.

The opening OP may expose the opening pattern OPP. The opening OP may define alignment marks AM with the opening pattern OPP in the non-display area NDA.

Specifically, the opening OP may expose the concave portions CCV. Accordingly, the concave portions CCV and the opening OP may define the alignment marks AM in the non-display area NDA. Each of the alignment marks AM may have an intaglio shape. That is, the alignment marks AM may be intaglio patterns defined by the concave portions CCV and the opening OP.

The light blocking member LBM may include at least one of carbon black, a black pigment, and a black dye. Accordingly, visibility of the alignment marks AM defined by the light blocking member LBM and the conductive pattern CDP may be improved.

The light blocking member LBM may overlap the second protruding member DAM2, and the opening OP may overlap the first protruding member DAM1. However, the present disclosure is not limited thereto, and the light blocking member LBM may also overlap the first protruding member DAM1.

Figure 6:
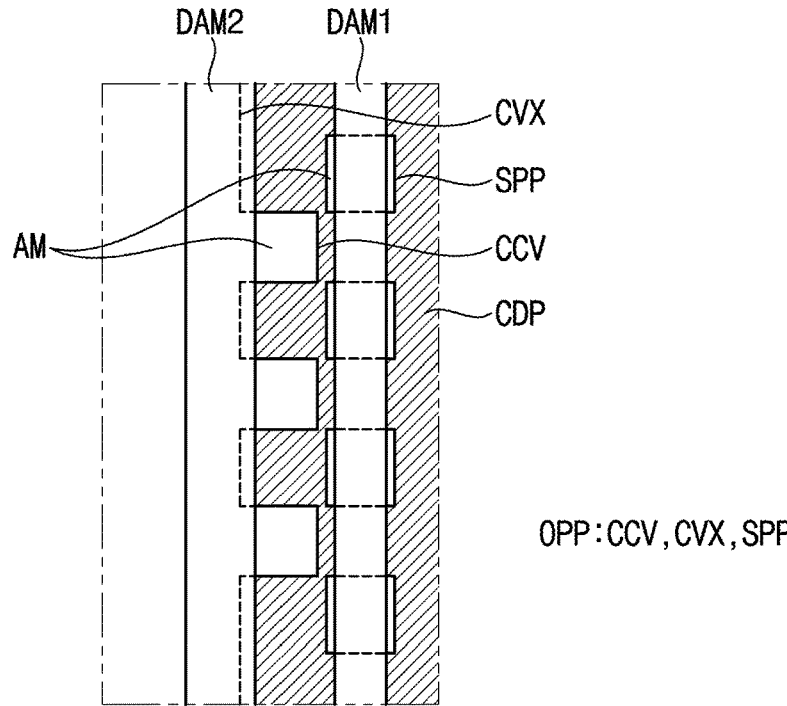
FIGS. 6 and 7 are plan views illustrating other examples of FIG. 5.
Figure 7:
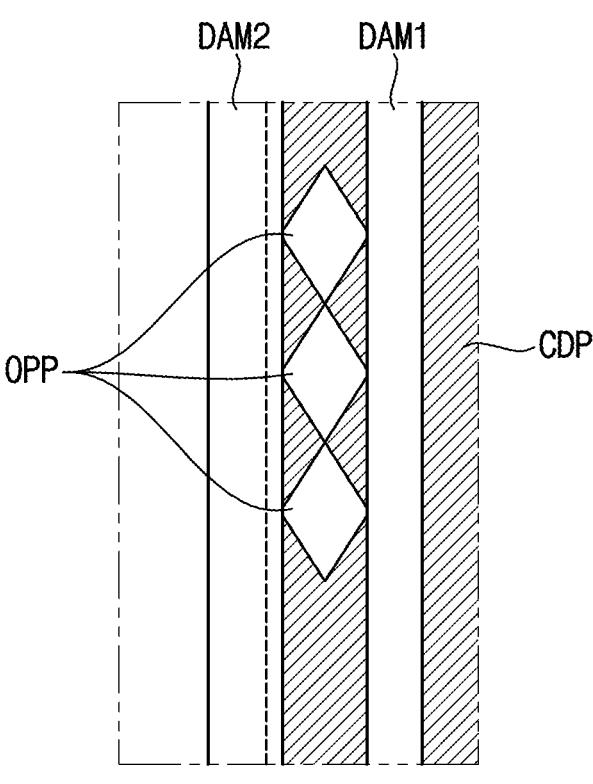

FIGS. 6 and 7 are plan views illustrating other examples of FIG. 5.

Referring to FIGS. 6 and 7, the opening pattern OPP may have an intaglio shape. The opening pattern OPP may have various shapes. For example, the intaglio shape may be one of a rectangle and a rhombus. However, the present disclosure is not limited thereto, and the intaglio shape may have various shapes. Accordingly, each of the alignment marks AM may also have an intaglio shape, and may have various shapes in the plan view.

Referring to FIG. 6, the opening pattern OPP of the conductive pattern CDP may further include sub-opening patterns SPP. The sub-opening patterns SPP may overlap the first protruding member DAM1. However, the present disclosure is not limited thereto. The sub-opening patterns SPP and the concave portions CCV may be alternately disposed. That is, the sub-opening patterns SSP and the concave portions CCV may be alternately arranged in a zigzag pattern.

Referring to FIG. 7, each of the alignment marks AM may have a rhombus shape. The alignment marks AM may be disposed between the first protruding member DAM1 and the second protruding member DAM2 in the plan view.

Figure 8:
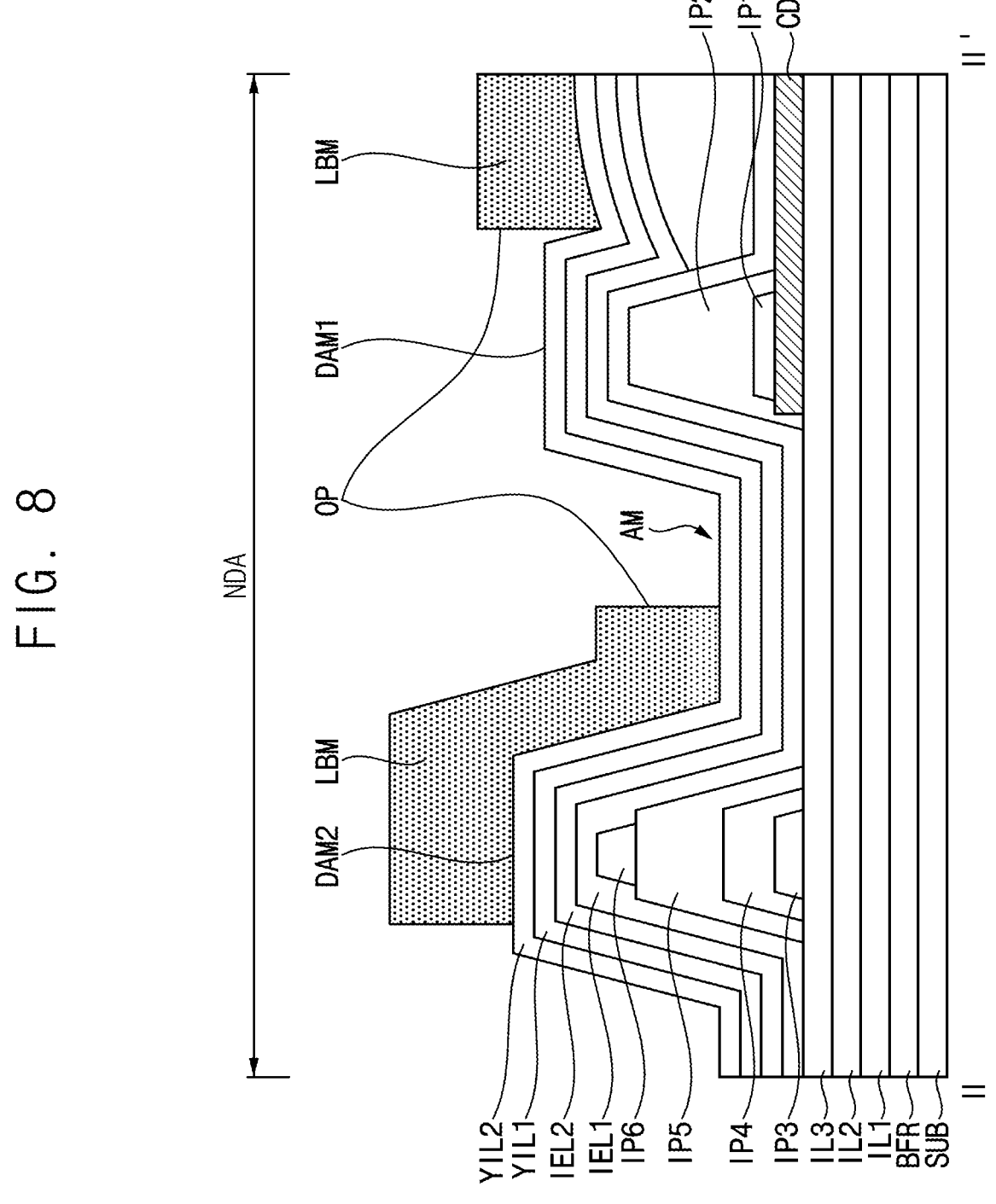
FIG. 8 is a cross-sectional view taken along line II-IF of FIG. 3.

FIG. 8 is a cross-sectional view taken along line II-IF of FIG. 3.

Referring to FIGS. 3 and 8, the conductive pattern CDP may be disposed on the substrate SUB in the non-display area NDA. Specifically, the conductive pattern CDP may be disposed on the third insulating layer IL3. The conductive pattern CDP may be disposed adjacent to the display area DA.

In the non-display area NDA, the first protruding member DAM1 and the second protruding member DAM2 may be disposed on the substrate SUB. Specifically, the first protruding member DAM1 may be disposed on the conductive pattern CDP to overlap the conductive pattern CDP.

The first protruding member DAM1 may have a single-layer structure or a multi-layer structure. For example, the first protruding member DAM1 may include a first insulating pattern IP1 and a second insulating pattern IP2. The first insulating pattern IP1 may be disposed on the conductive pattern CDP. The first insulating pattern IP1 may be disposed on the same layer as the fifth insulating layer IL5 of the display area DA. The first insulating pattern IP1 may include the same material as the fifth insulating layer IL5. The first insulating pattern IP1 may be formed using a half-tone mask, and thus a thickness of the first insulating pattern IP1 may be smaller than a thickness of the fifth insulating layer IL5.

The second insulating pattern IP2 may be disposed on the first insulating pattern IP1. The second insulating pattern IP2 may cover the first insulating pattern IP1. The second insulating pattern IP2 may be disposed on the same layer as the sixth insulating layer IL6 of the display area DA. The second insulating pattern IP2 may include the same material as the sixth insulating layer IL6.

In the non-display area NDA, the first inorganic encapsulation layer IEL1 and the second inorganic encapsulation layer IEL2 may extend from the display area DA. Similarly, the first touch insulating layer YIL1 and the second touch insulating layer YIL2 may extend from the display area DA. The first inorganic encapsulation layer IEL1, the second inorganic encapsulation layer IEL2, the first touch insulating layer YIL1, and the second touch insulating layer YIL2 may constitute the first protruding member DAM1 with the first insulating pattern IP1 and the second insulating pattern IP2.

The second protruding member DAM2 may be disposed on the third insulating layer IL3. The second protruding member DAM2 may have a single-layer structure or a multi-layer structure. The second protruding member DAM2 may include a third insulating pattern IP3, a fourth insulating pattern IP4, a fifth insulating pattern IP5, and a sixth insulating pattern IP6. The third insulating pattern IP3 may be disposed on the third insulating layer IL3. The third insulating pattern IP3 may be disposed on the same layer as the fourth insulating layer IL4 of the display area DA. The third insulating pattern IP3 may include the same material as the fourth insulating layer IL4.

The fourth insulating pattern IP4 may be disposed on the third insulating pattern IP3. The fourth insulating pattern IP4 may cover the third insulating pattern IP3. The fourth insulating pattern IP4 may be disposed on the same layer as the fifth insulating layer IL5 of the display area DA and the first insulating pattern IP1 of the non-display area NDA. The fourth insulating pattern IP4 may include the same material as the fifth insulating layer IL5 and the first insulating pattern IP1.

The fifth insulating pattern IP5 may be disposed on the fourth insulating pattern IP4. The fifth insulating pattern IP5 may cover the fourth insulating pattern IP4. The fifth insulating pattern IP5 may be disposed on the same layer as the sixth insulating layer IL6 of the display area DA and the second insulating pattern IP2 of the non-display area NDA. The fifth insulating pattern IP5 may include the same material as the sixth insulating layer IL6 and the second insulating pattern IP2.

The sixth insulating pattern IP6 may be disposed on the fifth insulating pattern IP5. The sixth insulating pattern IP6 may cover the fifth insulating pattern IP5. The sixth insulating pattern IP6 may be disposed on the same layer as the spacer of the display area DA. The sixth insulating pattern IP6 may include the same material as the spacer. However, the present disclosure is not limited thereto.

Like the first protruding member DAM1, the first inorganic encapsulation layer IEL1 and the second inorganic encapsulation layer IEL2 may extend from the display area DA to the non-display area NDA. Also, the first touch insulating layer YIL1 and the second touch insulating layer YIL2 may extend from the display area DA to the non-display area NDA. The first inorganic encapsulation layer IEL1, the second inorganic encapsulation layer IEL2, the first touch insulating layer YIL1, and the second touch insulating layer YIL2 may constitute the second protruding member DAM2 with the third insulating pattern IP3 to the sixth insulating pattern IP6.

In the non-display area NDA, the light blocking member LBM may be disposed on the first protruding member DAM1 and the second protruding member DAM2. Specifically, the light blocking member LBM may be disposed on the second touch insulating layer YIL2. The light blocking member LBM may be disposed on the same layer as the black matrix BM of the display area DA. The light blocking member LBM may include the same material as the black matrix BM. However, the present disclosure is not limited thereto.

The light blocking member LBM may partially overlap the conductive pattern CDP. The light blocking member LBM may not overlap the first protruding member DAM1. The light blocking member LBM may overlap the second protruding member DAM2 and may be disposed on the second protruding member DAM2.

The light blocking member LBM may include the opening OP. The opening OP may expose an area disposed between the first protruding member DAM1 and the second protruding member DAM2.

In an embodiment, since the alignment marks AM are defined in the intaglio shape in the non-display area NDA using the light blocking member LBM and the conductive pattern CDP, residual film and loss of the alignment marks AM may be prevented due to a step of each of the first protruding member DAM1 and the second protruding member DAM2. That is, since the alignment marks AM are formed in the intaglio shape instead of an embossed shape, the shape of the alignment marks AM may be maintained. Accordingly, a recognition rate of the alignment marks AM may be improved, and thus an efficiency of the manufacturing process of the display device 10 may be improved.

Figure 9:
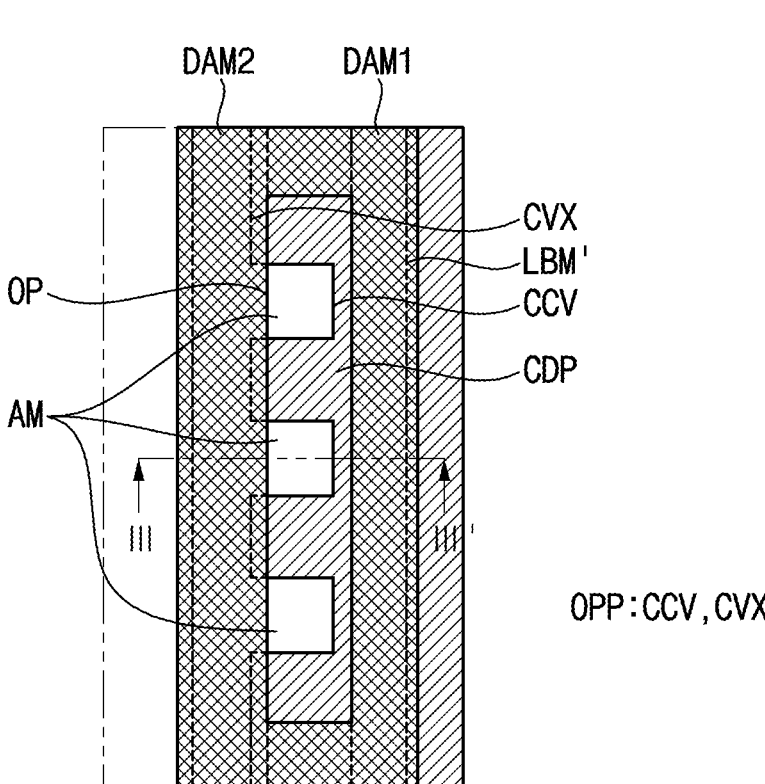
FIG. 9 is a plan view illustrating another example of FIG. 3.
Figure 10:
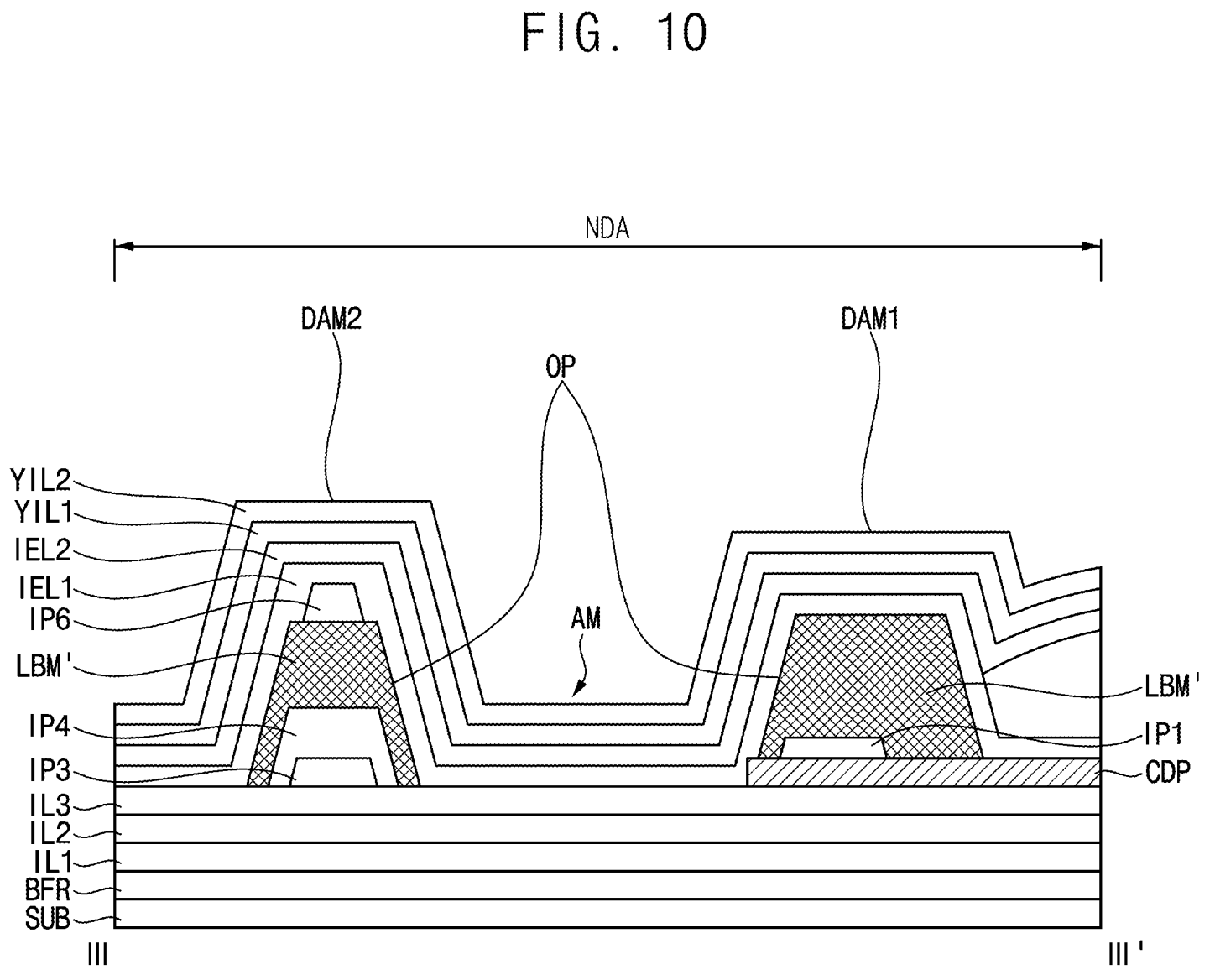

FIG. 9 is a plan view illustrating another example of FIG. 3. FIG. 10 is a cross-sectional view taken along line III-III' of FIG. 9.

A display device 11 described with reference to FIGS. 9 and 10 may be the same as the display device 10 described with reference to FIGS. 3 to 8 except for a first protruding member DAM1, a second protruding member DAM2, and a light blocking member LBM. Therefore, redundant descriptions may be omitted.

Referring to FIGS. 9 and 10, a display device 11 may include a conductive pattern CDP, a first protruding member DAM1, a second protruding member DAM2, and a light blocking member LBM'.

The first protruding member DAM1 may include a first sub-protruding member and a second sub-protruding member. The first sub-protruding member may be disposed on the substrate SUB, and the second sub-protruding member may be disposed on the first sub-protruding member.

The second protruding member DAM2 may include a third sub-protruding member and a fourth sub-protruding member. The third sub-protruding member may be disposed on the substrate SUB, and the fourth sub-protruding member may be disposed on the third sub-protruding member.

The light blocking member LBM' may be disposed on the conductive pattern CDP. The light blocking member LBM' may be disposed between the first sub-protruding member and the second sub-protruding member on the conductive pattern CDP. Also, the light blocking member LBM' may be disposed between the third sub-protruding member and the fourth sub-protruding member.

The first sub-protruding member may refer to a first insulating pattern IP1 disposed on the conductive pattern CDP. The second sub-protruding member may refer to the first inorganic encapsulation layer IEL1, the second inorganic encapsulation layer IEL2, the first touch insulating layer YIL1, and the second touch insulating layer YIL2 disposed on the light blocking member LBM' and overlapping the light blocking member LBM'.

The third sub-protruding member may refer to the third insulating pattern IP3 and the fourth insulating pattern IP4 disposed on the third insulating layer IL3. The fourth sub-protruding member may refer to sixth insulating pattern IP6, the first inorganic encapsulation layer IEL1, the second inorganic encapsulation layer IEL2, the first touch insulating layer YIL1, and the second touch insulating layer YIL2 disposed on the light blocking member LBM' and overlapping the light blocking member LBM'.

In an embodiment, the light blocking member LBM' may include an opening OP. The opening OP may be an area between the first protruding member DAM1 and the second protruding member DAM2 in the non-display area NDA in a plan view.

Specifically, the opening OP may expose the concave portions CCV. Accordingly, the concave portions CCV and the opening OP may define the alignment marks AM in the non-display area NDA. Each of the alignment marks AM may have an intaglio shape. That is, the alignment marks AM may be intaglio patterns defined by the concave portions CCV and the opening OP.

The light blocking member LBM' may include at least one of carbon black, a black pigment, and a black dye. Accordingly, visibility of the alignment marks AM defined by the light blocking member LBM' and the conductive pattern CDP may be improved.

The light blocking member LBM' may overlap the first protruding member DAM1 and the second protruding member DAM2. However, the present disclosure is not limited thereto.

Figure 11:
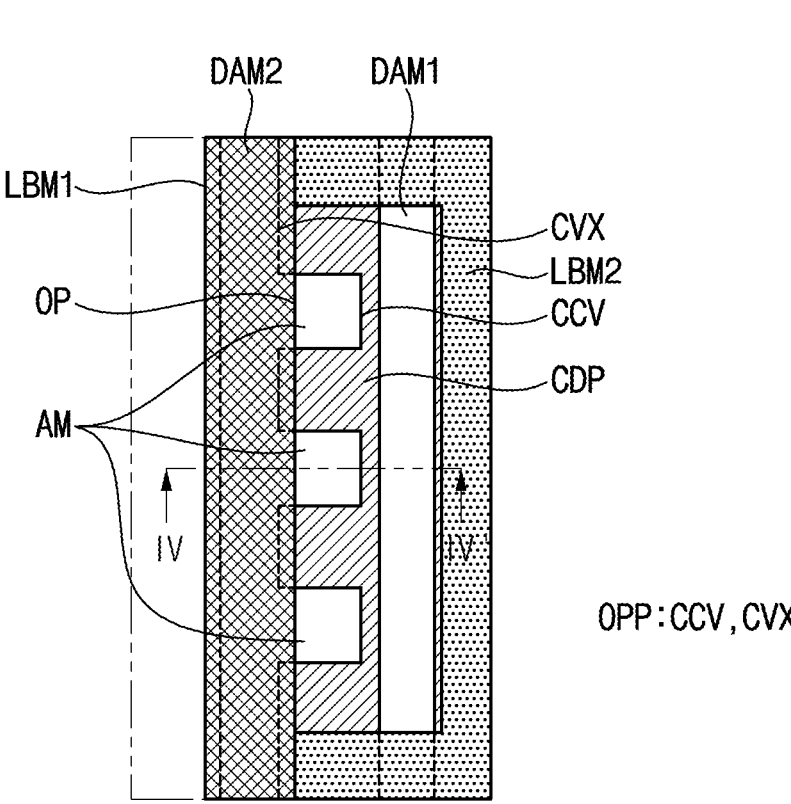
FIG. 11 is a plan view illustrating still another example of FIG. 3.
Figure 12:
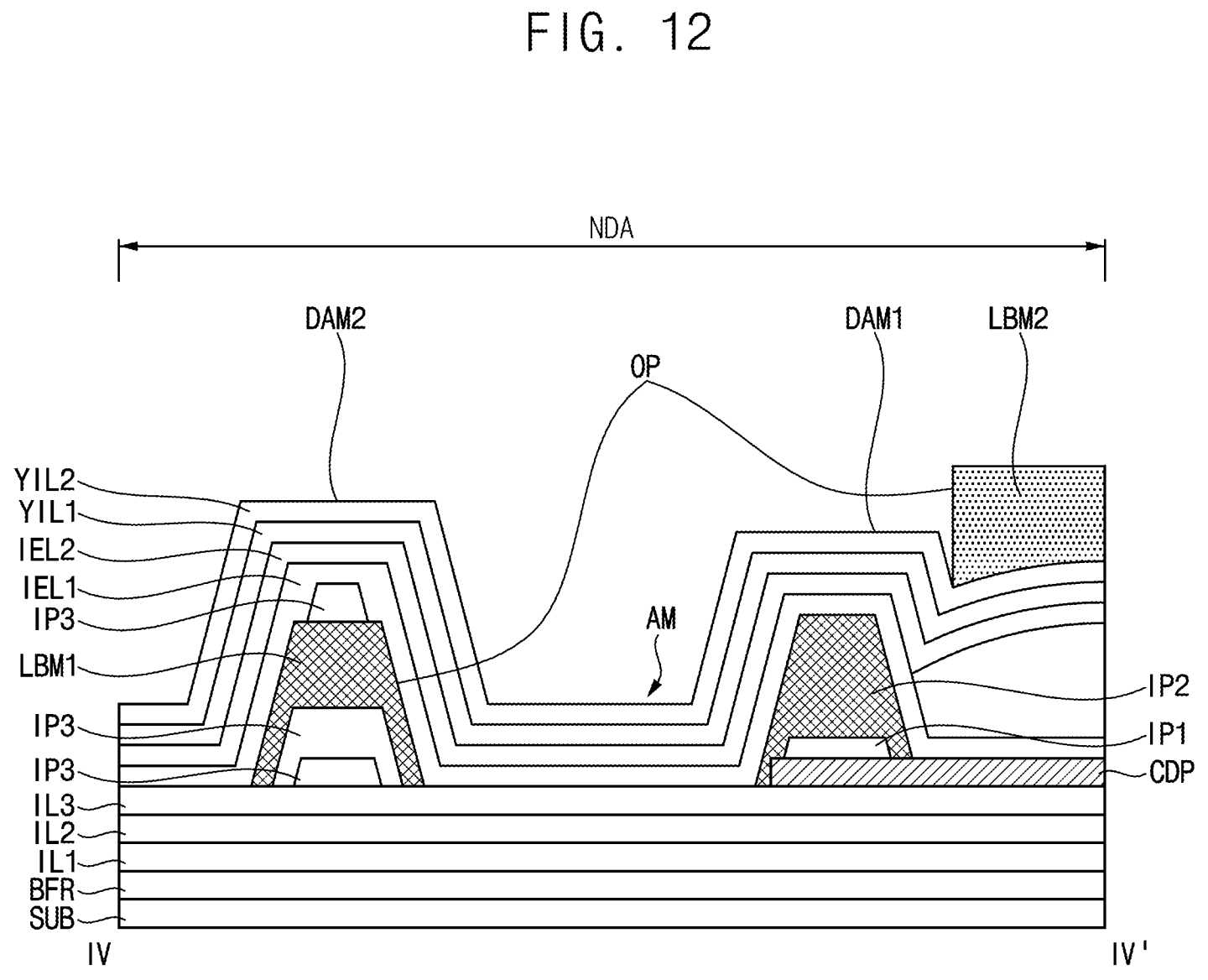

FIG. 11 is a plan view illustrating still another example of FIG. 3. FIG. 12 is a cross-sectional view taken along line IV-IV' of FIG. 9.

A display device 12 described with reference to FIGS. 11 and 12 may be the same as the display device 10 described with reference to FIGS. 3 to 8 except for a first protruding member DAM1, a second protruding member DAM2, a first light blocking member LBM1 and the second light blocking member LBM2. Therefore, redundant descriptions may be omitted.

Referring to FIGS. 11 and 12, the display device 12 may include a conductive pattern CDP, a first protruding member DAM1, a second protruding member DAM2, a first light blocking member LBM1, and a second light blocking member LBM2.

The conductive pattern CDP may be disposed in the non-display area NDA on the substrate SUB. The conductive pattern CDP may include an opening pattern OPP. For example, the conductive pattern CDP may have a concavo-convex structure in a plan view. Specifically, the conductive pattern CDP may include convex portions CVX and concave portions CCV in the plan view. The concave portions CCV may be disposed between the convex portions CVX.

The first protruding member DAM1 and the second protruding member DAM2 may be disposed in the non-display area NDA on the substrate SUB. The first protruding member DAM1 may surround the display area DA on the substrate SUB. The second protruding member DAM2 may surround the first protruding member DAM1. The first protruding member DAM1 may overlap the conductive pattern CDP on the conductive pattern CDP. The second protruding member DAM2 may partially overlap the conductive pattern CDP on the convex portions CVX. The concave portions CCV and the convex portions CVX included in the conductive pattern CDP may be disposed between the first light blocking member LBM1 and the second light blocking member LBM2 in the plan view. That is, the concave portions CCV and the convex portions CVX may be exposed by the opening OP.

The first light blocking member LBM1 may be disposed in the non-display area NDA. The first light blocking member LBM1 may be disposed on the conductive pattern CDP. The first light blocking member LBM1 may partially overlap the convex portions CVX of the conductive pattern CDP. However, the present disclosure is not limited thereto, and the first light blocking member LBM1 may not overlap the conductive pattern CDP.

The second light blocking member LBM2 may be disposed in the non-display area NDA. The second light blocking member LBM2 may be disposed on the first light blocking member LBM1. The second light blocking member LBM2 and the first light blocking member LBM1 may define an opening OP in the plan view. The second light blocking member LBM2 may not overlap the first light blocking member LBM1. However, the present disclosure is not limited thereto, and the second light blocking member LBM2 and the first light blocking member LBM1 may partially overlap.

Specifically, the first light blocking member LBM1 may be disposed on the same layer as the sixth insulating layer IL6 of the display area DA and the second insulating pattern IP2 of the non-display area NDA.

The second light blocking member LBM2 may be disposed on the second touch insulating layer YIL2. The second light blocking member LBM2 may extend from the light blocking member LBM of the display area DA.

The first light blocking member LBM1 may have a straight shape. Also, the second light blocking member LBM2 may have a left-right inverted ' E' shape. Accordingly, the first light blocking member LBM1 and the second light blocking member LBM2 may define the opening OP in the plan view. However, the present disclosure is not limited thereto.

In an embodiment, the concave portions CCV included in the conductive pattern CDP and the first light blocking member LBM1 may define alignment marks AM in the non-display area NDA. That is, the opening OP defined by the first light blocking member LBM1 and the second light blocking member LBM2 may expose the opening pattern OPP. Accordingly, the alignment marks AM may be defined in the non-display area NDA. Also, in this case, the first light blocking member LBM1 may overlap the second protruding member DAM2.

Figure 13:
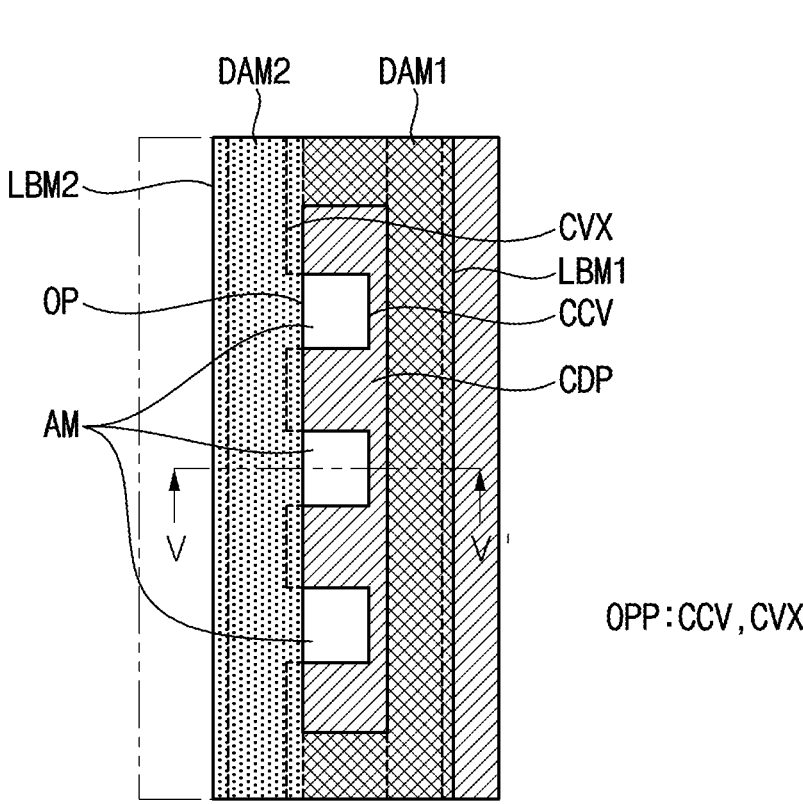
FIG. 13 is a plan view illustrating another example of FIG. 11.
Figure 14:
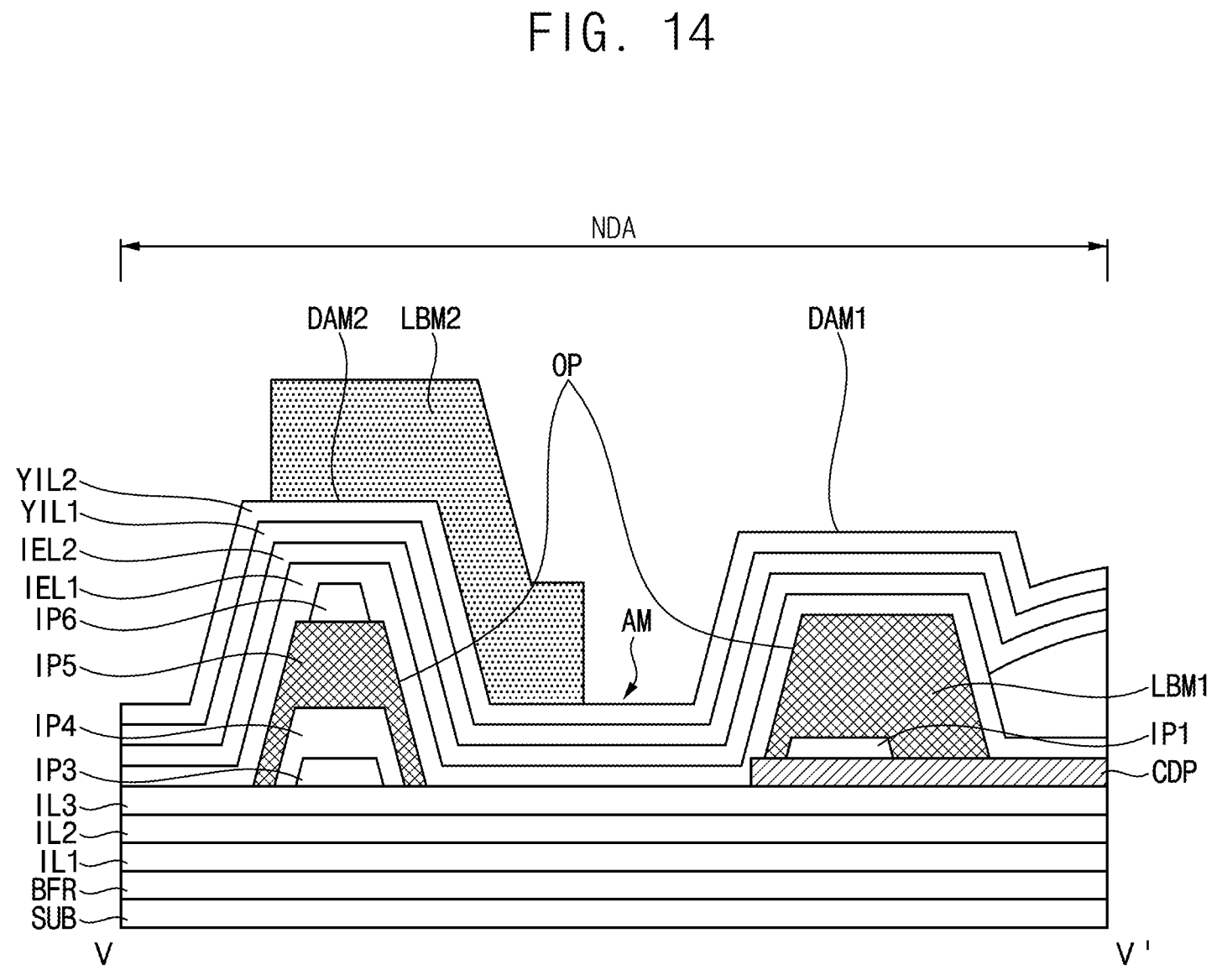

FIG. 13 is a plan view illustrating another example of FIG. 11. FIG. 14 is a cross-sectional view taken along line V-V' of FIG. 13.

A display device 13 described with reference to FIGS. 13 and 14 may be the same as the display device 12 described with reference to FIG. 11 except for a first light blocking member LBM1 and a second light blocking member LBM2. Therefore, redundant descriptions may be omitted.

Referring to FIGS. 13 and 14, a display device 13 may include a conductive pattern CDP, a first protruding member DAM1, a second protruding member DAM2, a first light blocking member LBM1, and a second light blocking member LBM2.

The first protruding member DAM1 and the second protruding member DAM2 may be disposed in the non-display area NDA on the substrate SUB. The first protruding member DAM1 may overlap the conductive pattern CDP on the conductive pattern CDP. The second protruding member DAM2 may partially overlap the conductive pattern CDP. The concave portions CCV and the convex portions CVX included in the conductive pattern CDP may be disposed between the first light blocking member LBM1 and the second light blocking member LBM2 in the plan view. That is, the concave portions CCV and the convex portions CVX may be exposed by the opening OP.

The first light blocking member LBM1 may be disposed in the non-display area NDA. The second light blocking member LBM2 may be disposed in the non-display area NDA. The second light blocking member LBM2 may be disposed on the first light blocking member LBM1. The second light blocking member LBM2 and the first light blocking member LBM1 may define an opening OP in the plan view. The second light blocking member LBM2 may not overlap the first light blocking member LBM1. However, the present disclosure is not limited thereto, and the second light blocking member LBM2 and the first light blocking member LBM1 may partially overlap.

Specifically, the first light blocking member LBM1 may be disposed on the same layer as the sixth insulating layer IL6 of the display area DA and the second insulating pattern IP2 of the non-display area NDA.

The second light blocking member LBM2 may be disposed on the second touch insulating layer YIL2. The second light blocking member LBM2 may extend from the light blocking member LBM of the display area DA. Also, the second light blocking member LBM2 may be disposed on the second protruding member DAM2.

The first light blocking member LBM1 may have a left-right inverted 'E' shape. Also, the second light blocking member LBM2 may have a straight shape. Accordingly, the first light blocking member LBM1 and the second light blocking member LBM2 may define the opening OP in the plan view. However, the present disclosure is not limited thereto.

In an embodiment, the concave portions CCV included in the conductive pattern CDP and the second light blocking member LBM2 may define alignment marks AM in the non-display area NDA. That is, the opening OP defined by the first light blocking member LBM1 and the second light blocking member LBM2 may expose the alignment marks AM. Also, in this case, the second light blocking member LBM2 may overlap the second protruding member DAM2.

Figure 15:
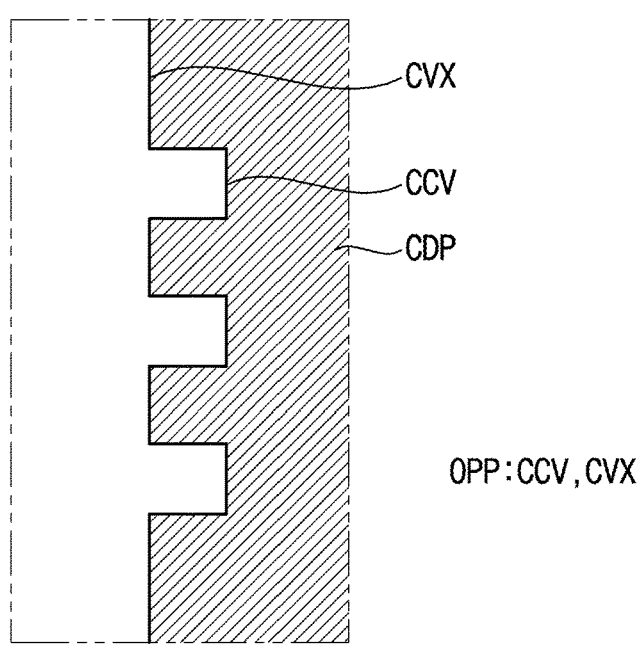
FIGS. 15, 16 and 17 are views for explaining a method of manufacturing a display device according to an embodiment of the present disclosure.
Figure 16:
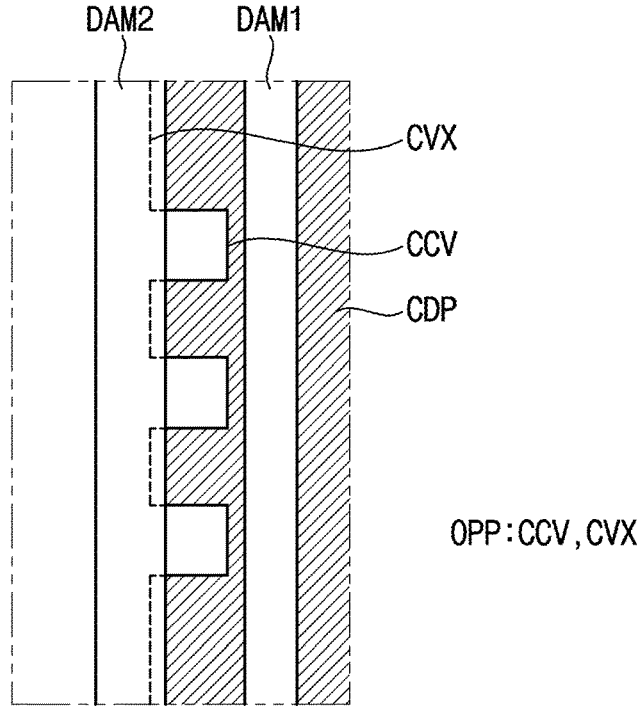
Figure 17:
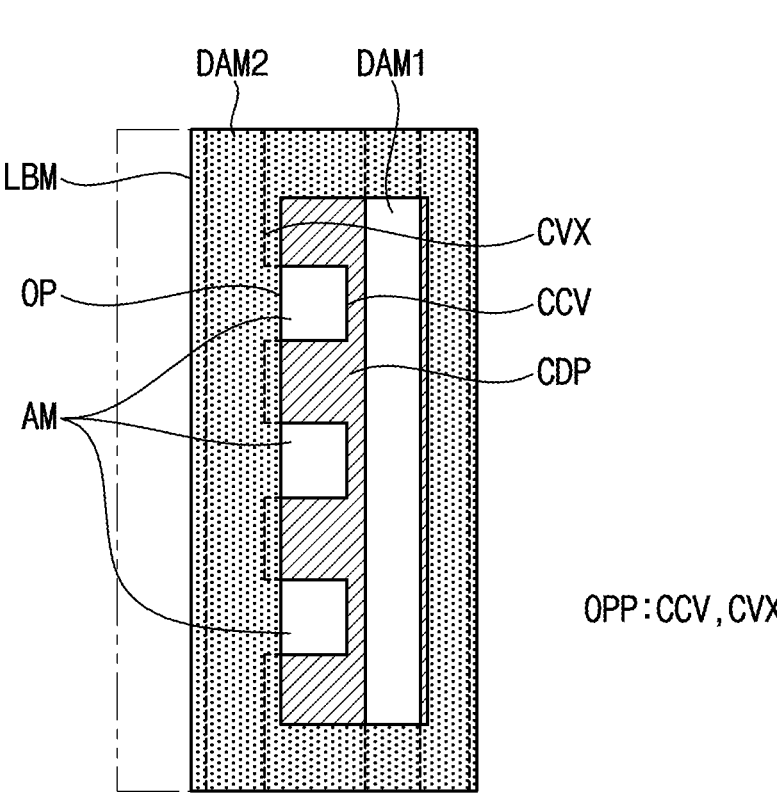

FIGS. 15 to 17 are views for explaining a method of manufacturing a display device according to an embodiment of the present disclosure.

Referring to FIG. 15, the conductive pattern CDP may be formed in the non-display area NDA on the substrate SUB. The conductive pattern CDP may be formed on the third insulating layer (e.g., the third insulating layer IL3 of FIG. 8) on the substrate SUB. However, the present disclosure is not limited thereto.

The conductive pattern CDP may be formed to be connected to the first conductive layer formed in the display area DA. That is, the conductive pattern CDP may be formed simultaneously with the first conductive layer.

The conductive pattern CDP may be patterned to form an opening pattern OPP. The opening pattern OPP may be formed in various shapes. For example, the opening pattern OPP may include convex portions CVX and concave portions CCV. The concave portions CCV may be formed between the convex portions CVX.

Further referring to FIG. 16, a first protruding member DAM1 and a second protruding member DAM2 may be formed on the conductive pattern CDP. Specifically, the first protruding member DAM1 may be formed to overlap the conductive pattern CDP. The second protruding member DAM2 may be formed to be spaced apart from the first protruding member DAM.

The first protruding member DAM1 and the second protruding member DAM2 may be formed such that the convex portions CVX and the concave portions CCV are disposed between the first protruding member DAM1 and the second protruding member DAM2 in the plan view. The first protruding member DAM1 and the second protruding member DAM2 may be simultaneously formed with the display panel DP, the touch member TM, and the black matrix BM in the display area DA.

Further referring to FIG. 17, a light blocking member LBM may be formed on the first protruding member DAM1 and the second protruding member DAM2. Specifically, the preliminary light blocking member may be entirely formed on the first protruding member DAM1 and the second protruding member DAM2 in the non-display area NDA. The preliminary light blocking member may be formed of at least one of carbon black, a black pigment, and a black dye.

An opening OP may be formed in the preliminary light blocking member LBM to expose an area between the first protruding member DAM1 and the second protruding member DAM2 among the non-display area NDA. That is, the opening OP may be formed to expose the concave portions CCV. By forming the opening OP, the light blocking member LBM may be formed.

The opening OP and the concave portions CCV may form alignment marks AM. The alignment marks AM may have an intaglio shape. The intaglio shape may be easily recognized due to the light blocking member LBM and the conductive pattern CDP. Accordingly, the alignment marks AM may not be lost, and the shapes of the alignment marks AM may be maintained on the non-display area NDA. Accordingly, a recognition rate of the alignment marks AM may be improved, and thus efficiency in the manufacturing process of the display device may be improved.

The display devices according to the embodiments may be applied to a display device included in a computer, a notebook, a mobile phone, a smartphone, a smart pad, a PMP, a PDA, an MP3 player, or the like.

Although the display devices according to the embodiments have been described with reference to the drawings, the illustrated embodiments are examples, and may be modified and changed by a person having ordinary knowledge in the relevant technical field without departing from the technical spirit described in the following claims.

What is claimed is:

1. A display device comprising:
a substrate including a display area and a non-display area surrounding the display area;
a conductive pattern disposed on the substrate in the non-display area and including an opening pattern; and
a light blocking member disposed in the non-display area on the conductive pattern and including an opening disposed in an area overlapping the opening pattern,
wherein the opening pattern and the opening are formed in a same side with respect to the substrate and define alignment marks in the non-display area.

2. The display device of claim 1, wherein the opening pattern includes convex portions and concave portions disposed between the convex portions.

3. The display device of claim 1, wherein each of the alignment marks has an intaglio shape, and the intaglio shape has one of a rectangle, a triangle, and a rhombus shape in a plan view.

4. The display device of claim 1, wherein the light blocking member includes at least one of carbon black, a black pigment, or a black dye.

5. The display device of claim 1, further comprising:
a first protruding member disposed on the substrate in the non-display area, overlapping the conductive pattern, and surrounding the display area.

6. The display device of claim 5, wherein the light blocking member is disposed on the first protruding member and the opening is disposed in an area overlapping the first protruding member.

7. The display device of claim 5, further comprising:
a second protruding member disposed on the substrate in the non-display area and surrounding the first protruding member.

8. The display device of claim 7, wherein the opening pattern is disposed between the first protruding member and the second protruding member in a plan view.

9. The display device of claim 7, wherein the opening is disposed in an area overlapping an area disposed between the first protruding member and the second protruding member in the non-display area in a plan view.

10. The display device of claim 7, wherein the light blocking member is disposed on the second protruding member and overlaps the second protruding member.

11. The display device of claim 7, wherein the first protruding member includes a first sub-protruding member disposed on the substrate and a second sub-protruding member disposed on the first sub-protruding member, and wherein the light blocking member is disposed between the first sub-protruding member and the second sub-protruding member on the conductive pattern.

12. The display device of claim 7, wherein the second protruding member includes a third sub-protruding member disposed on the substrate and a fourth sub-protruding member disposed on the third sub-protruding member, and wherein the light blocking member is disposed between the third sub-protruding member and the fourth sub-protruding member.

13. A display device comprising:

a substrate including a display area and a non-display area surrounding the display area;

a conductive pattern disposed on the substrate in the non-display area and including an opening pattern;

a light blocking member disposed in the non-display area on the conductive pattern and including an opening disposed in an area overlapping the opening pattern; and a first protruding member disposed on the substrate in the non-display area, overlapping the conductive pattern, and surrounding the display area, wherein the opening pattern and the opening constitute alignment marks in the non-display area, and wherein the conductive pattern further includes a sub-opening pattern disposed in an area overlapping the first protruding member.

14. A display device comprising:

a substrate including a display area and a non-display area surrounding the display area;

a conductive pattern disposed on the substrate in the non-display area and including an opening pattern;

a first light blocking member disposed in the non-display area and on the conductive pattern; and a second light blocking member disposed in the non-display area, on the first light blocking member, and defining an opening with the first light blocking member in a plan view, wherein the opening is disposed in an area overlapping the opening pattern, and the opening pattern and the opening are formed in a same side with respect to the substrate.

15. The display device of claim 14, further comprising:

a first protruding member disposed on the substrate in the non-display area, overlapping the conductive pattern, and surrounding the display area; and a second protruding member disposed on the substrate in the non-display area and surrounding the first protruding member.

16. The display device of claim 15, wherein the opening pattern includes convex portions and concave portions disposed between the convex portions, and wherein the convex portions and the concave portions are disposed between the first light blocking member and the second light blocking member in a plan view.

17. The display device of claim 16, wherein the concave portions and the first light blocking member constitute alignment marks in the non-display area.

18. The display device of claim 17, wherein the opening is disposed in an area overlapping the alignment marks, and wherein the first light blocking member overlaps the second protruding member.

19. The display device of claim 16, wherein the concave portions included in the conductive pattern and the second light blocking member constitute alignment marks in the non-display area.

20. The display device of claim 19, wherein the opening is disposed in an area overlapping the alignment marks, and wherein the second light blocking member overlaps the second protruding member.

* * * * *